United States Patent
Ono et al.

(10) Patent No.: US 7,061,047 B2
(45) Date of Patent: Jun. 13, 2006

(54) SEMICONDUCTOR DEVICE HAVING TRENCH GATE STRUCTURE AND MANUFACTURING METHOD THEREOF

(75) Inventors: Syotaro Ono, Yokohama (JP); Yusuke Kawaguchi, Miura-gun (JP); Akio Nakagawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/682,111

(22) Filed: Oct. 10, 2003

(65) Prior Publication Data

US 2005/0029586 A1 Feb. 10, 2005

(30) Foreign Application Priority Data

Aug. 5, 2003 (JP) .............................. 2003-205983

(51) Int. Cl.
*H01L 29/772* (2006.01)
(52) U.S. Cl. ...................... 257/330; 257/332; 257/333; 257/335; 257/339; 257/342
(58) Field of Classification Search ................ 257/330, 257/332, 333, 335, 339, 342
See application file for complete search history.

(56) References Cited

U.S. PATENT DOCUMENTS

| | | | | |
|---|---|---|---|---|
| 4,893,160 A | * | 1/1990 | Blanchard | 257/334 |
| 5,674,766 A | * | 10/1997 | Darwish et al. | 438/270 |
| 5,821,583 A | * | 10/1998 | Hshieh et al. | 257/330 |
| 5,929,481 A | * | 7/1999 | Hshieh et al. | 257/328 |
| 6,008,520 A | * | 12/1999 | Darwish et al. | 257/330 |
| 6,160,288 A | * | 12/2000 | Yamada | 257/330 |
| 6,262,453 B1 | * | 7/2001 | Hshieh | 257/341 |
| 6,600,193 B1 | * | 7/2003 | Darwish | 257/330 |
| 6,657,254 B1 | * | 12/2003 | Hshieh et al. | 257/330 |
| 6,781,200 B1 | * | 8/2004 | Ishimura et al. | 257/330 |
| 2003/0006454 A1 | | 1/2003 | Darwish | |
| 2003/0032248 A1 | | 2/2003 | Yue et al. | |
| 2003/0235959 A1 | * | 12/2003 | Lichtenberger et al. | 438/272 |
| 2004/0070028 A1 | * | 4/2004 | Azam et al. | 257/330 |

FOREIGN PATENT DOCUMENTS

| | | |
|---|---|---|
| JP | 11-26758 | 1/1999 |
| JP | 2000-164869 | 6/2000 |
| JP | 2000-269487 | 9/2000 |
| JP | 2003-17696 | 1/2003 |

\* cited by examiner

*Primary Examiner*—Allan R. Wilson
(74) *Attorney, Agent, or Firm*—Oblon, Spivak, McClelland, Maier & Neustadt, P.C.

(57) ABSTRACT

A vertical MOSFET includes a base region formed on a drain region and a source region formed in the base region. A trench is formed to extend from the surface of the source region and penetrate the source region and has depth to reach a portion near the drain region. A gate insulating film is formed on the side walls and bottom portion of the trench and the gate electrode is formed in the trench. The impurity concentration profile of the base region has a first peak in a portion near the interface between the source region and the base region and a second peak which is formed in a portion near the interface between the base region and the drain region and is lower than the first peak. The threshold voltage is determined based on the first peak and the dose amount is determined based on the second peak.

56 Claims, 11 Drawing Sheets

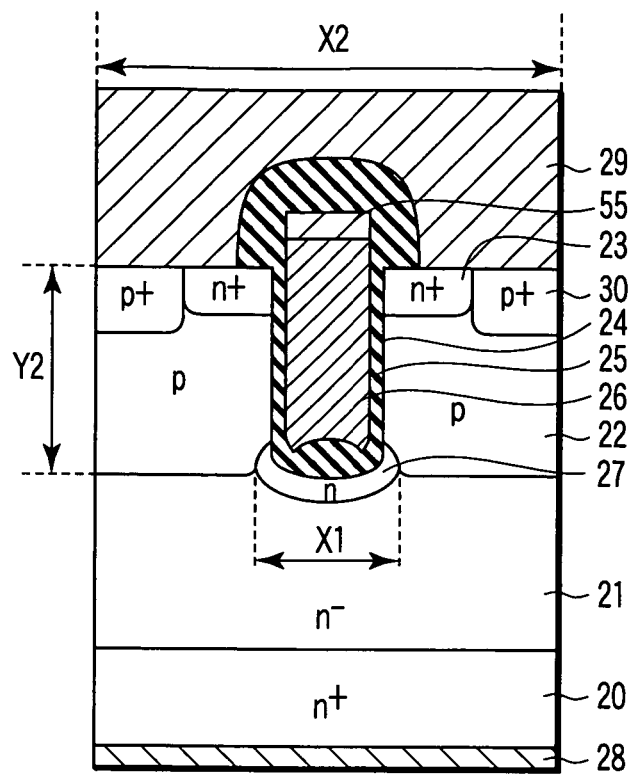
F I G. 25
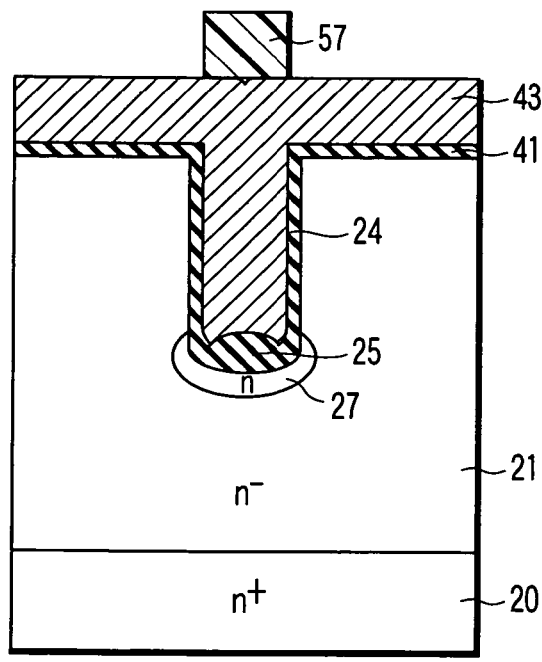
F I G. 26

SEMICONDUCTOR DEVICE HAVING TRENCH GATE STRUCTURE AND MANUFACTURING METHOD THEREOF

CROSS-REFERENCE TO RELATED APPLICATIONS

This application is based upon and claims the benefit of priority from the prior Japanese Patent Application No. 2003-205983, filed Aug. 5, 2003, the entire contents of which are incorporated herein by reference.

BACKGROUND OF THE INVENTION

1. Field of the Invention

This invention relates to a semiconductor device and a manufacturing method thereof and is applied, for example, to a vertical MOSFET or the like having a trench gate structure.

2. Description of the Related Art

A trench gate structure configured by forming trenches (grooves) in the main surface of a semiconductor substrate and forming gate electrodes by the use of the trenches is applied to a semiconductor device such as an insulated gate bipolar transistor (IGBT) or vertical metal oxide semiconductor field effect transistor (vertical MOSFET), for example. It is mainly used for a power supply (for example, refer to Jpn. Pat. Appln. KOKAI Publication No. 2000-164869) or the like.

The above vertical MOSFET having a trench gate structure has a grater current capacity and lower ON resistance in comparison with the conventional double metal oxide semiconductor (DMOS) transistor and the cost thereof can be expected to be lowered due to chip shrink. Further, since a withstand voltage of approximately several tens of volts to several hundreds of volts can be attained, it can be widely used for a switching power supply of a mobile terminal, personal computer or the like.

However, for example, a power supply system which supplies electric power is desired to perform high-speed and highly efficient operation with an increase in the operation speed of a central processing unit (CPU) of the personal computer or the like. Therefore, in the vertical MOSFET used in the output stage of a DC/DC converter power supply circuit, it becomes particularly important to enhance the switching characteristic thereof with an increase in the operation speed.

In order to enhance the switching characteristic, particularly, it is necessary to reduce the ON resistance and the feedback capacitance between the gate and drain. For example, in an element having a low withstand voltage of 100 V or less, since the proportion of the channel resistance to the ON resistance of the element becomes higher, the ON-resistance tends to become more important.

Next, a conventional semiconductor device is explained by taking the vertical MOSFET as an example. FIG. 30 is a cross-sectional view showing the main portion of a conventional vertical MOSFET. As shown in FIG. 30, a trench 14 is formed deep so that the bottom portion thereof will be formed in an n⁻-type drain region 11. A gate electrode 15 is filled in the internal portion of the trench 14. Therefore, the length of a channel formed between an n⁺-type source region 13 and the n⁻-type drain region 11 is increased and the ON resistance becomes larger. Further, since the area of a portion of the n⁻-type drain region 11 which faces the gate electrode 15 is increased, the feedback capacitance between the gate and drain is increased. As a result, the Millar charging period at the ON/OFF time becomes longer and it cannot be expected to attain a high-speed switching operation. Therefore, in order to realize a semiconductor device in which the switching characteristic is enhanced, it is desired to reduce the ON resistance and the feedback capacitance between the gate and the drain.

BRIEF SUMMARY OF THE INVENTION

A semiconductor device according to one aspect of the invention comprises a first semiconductor layer of a first conductivity type, a second semiconductor layer of a second conductivity type formed on the first semiconductor layer, a third semiconductor layer of the first conductivity type formed in the second semiconductor layer and electrically isolated from the first semiconductor layer, a trench formed to extend from the surface of the third semiconductor layer and penetrate the third semiconductor layer and having depth to reach at least a portion lying near the first semiconductor layer, a first insulating film formed on side walls and a bottom portion of the trench, a first electrode formed at least partly on the first insulating film in the trench and electrically isolated from the first to third semiconductor layers, and a fourth semiconductor layer of the first conductivity type formed near the trench on an interface between the first and second semiconductor layers and having an impurity concentration higher than that of the first semiconductor layer, wherein a profile of the impurity concentration of the second semiconductor layer has a first peak in a portion near an interface between the third and second semiconductor layers and a second peak which is lower than the first peak and lying in a portion near an interface between the second and fourth semiconductor layers, threshold voltage is determined based on the first peak and a dose amount of the second semiconductor region is determined based on the second peak.

A method of manufacturing a semiconductor device according to still another aspect of the invention comprises forming a second semiconductor layer of a second conductivity type on a first semiconductor layer of a first conductivity type, forming a third semiconductor layer of the first conductivity type which is electrically isolated from the first semiconductor layer on a surface region of the second semiconductor layer, forming a trench which extends from the surface of the third semiconductor layer, penetrates the third semiconductor layer and has depth to reach at least a portion lying near the first semiconductor layer, forming a first insulating film on side walls and a bottom portion of the trench, forming a fourth semiconductor layer of the first conductivity type near the trench on an interface between the first and second semiconductor layers, the fourth semiconductor layer having an impurity concentration higher than that of the first semiconductor layer, and forming a first electrode at least partly on the first insulating film in the trench, the first electrode being electrically isolated from the first to third semiconductor layers, wherein the forming the second semiconductor layer includes forming a first peak in a portion near an interface between the third and second semiconductor layers to determine threshold voltage, and forming a second peak which is lower than the first peak in a portion near an interface between the second and fourth semiconductor layers to determine a dose amount of the second semiconductor layer.

BRIEF DESCRIPTION OF THE SEVERAL VIEWS OF THE DRAWING

FIG. 25 is a cross-sectional view showing a semiconductor device according to a fourth embodiment of this invention;

FIGS. 26 and 27 are cross-sectional views showing manufacturing steps for forming the semiconductor device according to the fourth embodiment of this invention;

DETAILED DESCRIPTION OF THE INVENTION

There will now be described embodiments of this invention with reference to the accompanying drawings. In the following explanation, common reference symbols are attached to like portions throughout the drawings.

[First Embodiment]

Figure 1:
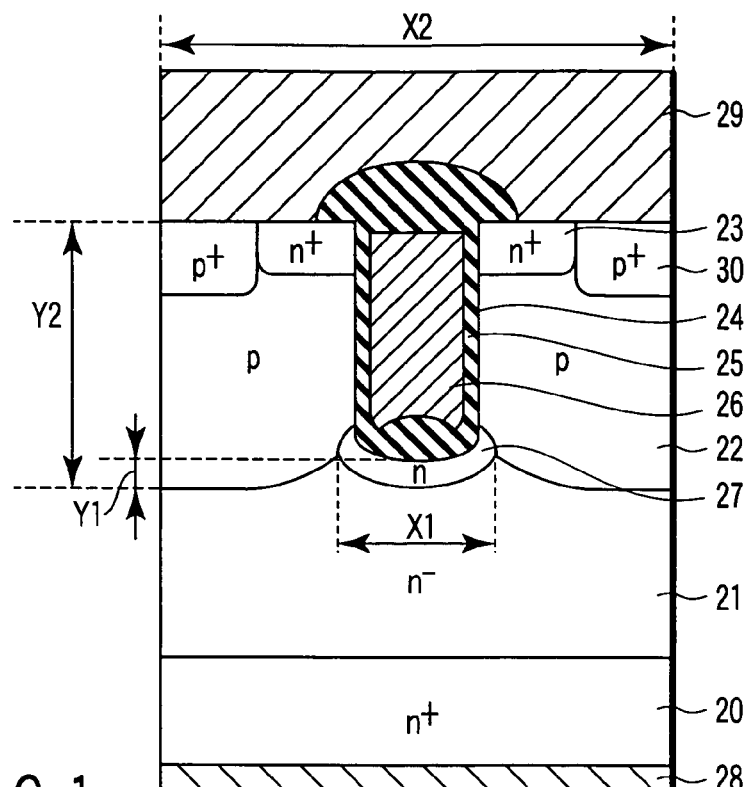
FIG. 1 is a cross-sectional view showing the main portion of a vertical MOSFET, for illustrating a semiconductor device according to a first embodiment of this invention.

First, a semiconductor device according to a first embodiment of this invention is explained with reference to FIGS. 1 to 6. FIG. 1 is a cross-sectional view showing the main portion of a vertical MOSFET, for illustrating the semiconductor device according to the first embodiment of this invention.

As shown in FIG. 1, a drain region (a first semiconductor layer of a first conductivity type) 21 formed of an n⁻-type epitaxial layer (drift layer) is formed on the main surface of an n⁺-type semiconductor substrate 20. Further, a p-type base region (a second semiconductor layer of a second conductivity type) 22 is formed on the n⁻-type drain region 21. In addition, n⁺-type source regions (third semiconductor layers of the first conductivity type) 23 are formed on the p-type base region 22.

A trench 24 is formed to extend from the surface of the source region 23 and penetrate the base region 22 and has depth to reach the epitaxial layer (drain region) 21. A gate insulating film 25 is formed on the side walls and bottom portion of the trench 24 and a gate electrode 26 is formed or filled in the trench 24 while it is electrically isolated from the respective semiconductor layers (n⁻-type drain region 21, p-type base region 22, n-type source regions 23) by the gate insulating film 25. Further, an n-type semiconductor layer 27 having an impurity concentration higher than that of the n⁻-type drain region 21 is formed on boundary portions between the gate insulating film 25, p-type base region 22 and n⁻-type drain region 21.

At least part of the insulating film 25 which is formed in contact with the n-type semiconductor layer 27 is formed thicker than the other portion. Further, p⁺-type semiconductor layers 30 are formed in contact with the n⁺-type source regions 23 on the p-type base region 22. A drain electrode 28 is formed on the surface (rear surface) of the n⁺-type semiconductor substrate 20 which is opposite to the main surface thereof. Further, a source electrode 29 is formed on the insulating film 25, n⁺-type source regions 23 and p⁺-type semiconductor layers 30. The p⁺-type semiconductor layer 30 and n⁺-type source region 23 are formed in ohmic-contact with the source electrode 29.

The impurity concentration profile of part of the p-type base region 22 which faces the gate electrode 26 with the gate insulating film 25 disposed therebetween has a first peak in a portion near the interface between the n⁺-type source region 23 and the p-type base region 22 and a second peak having the impurity concentration lower than that of the first peak and lying in a portion near the interface between the p-type base region 22 and the n⁻-type drain region 21. The threshold voltage of the MOSFET is determined based on the first peak and the dose amount of the p-type base region 22 is determined based on the second peak. The impurity concentration profile of the p-type base region 22 is explained in more detail with reference to FIGS. 2 to 4.

Figure 2:
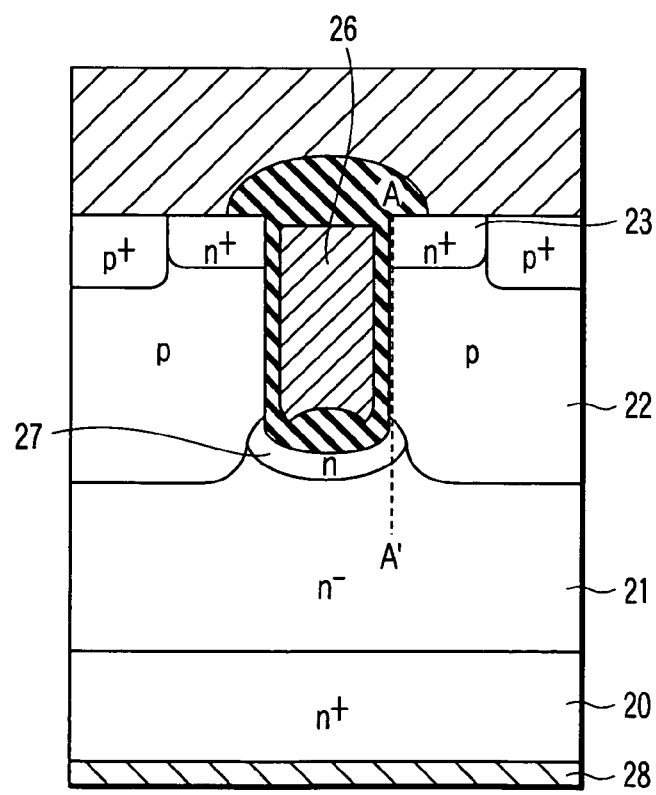
FIG. 2 is a cross-sectional view for illustrating an impurity concentration profile of a p-type base region of the semiconductor device according to the first embodiment of this invention.
Figure 3:
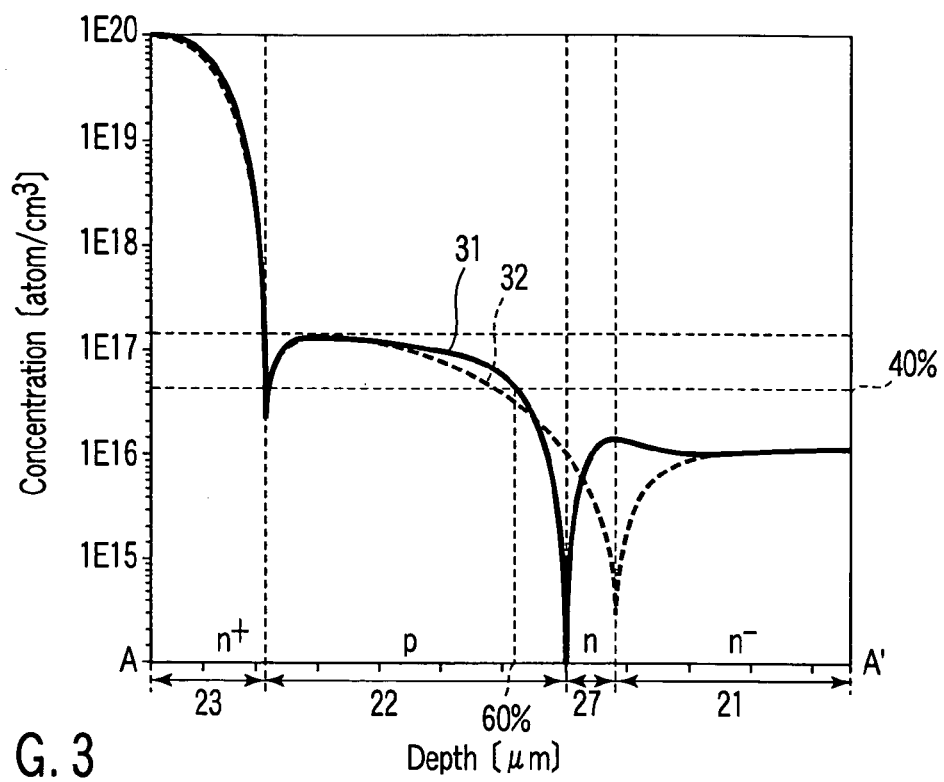
FIG. 3 is a diagram showing an impurity concentration profile along the A–A' line in FIG. 2.
Figure 30:
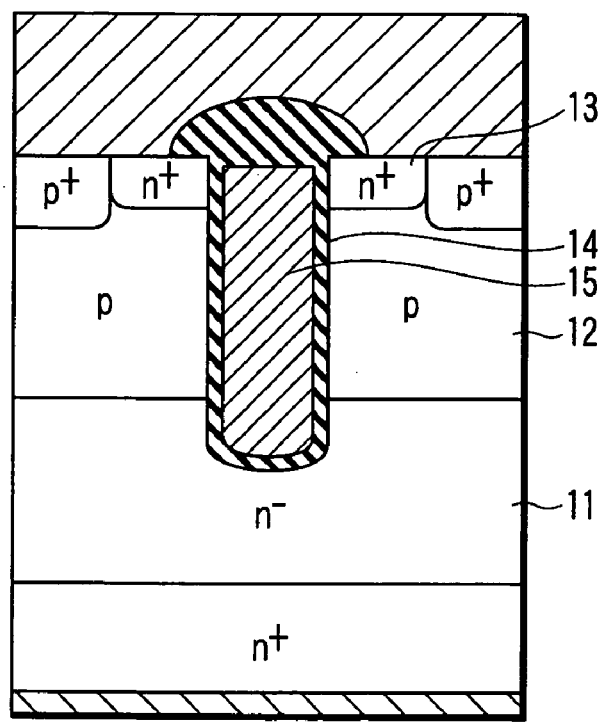
FIG. 30 is a cross-sectional view showing a conventional semiconductor device.

FIG. 2 is a cross-sectional view showing the main portion of the semiconductor device according to the first embodiment of this invention, for illustrating the impurity concentration profile of the p-type base region 22. FIG. 3 is a diagram showing the impurity concentration profile along the A–A' line in FIG. 2. A solid line 31 in FIG. 3 indicates the impurity concentration profile along the A–A' line in FIG. 2 and broken lines 32 indicate the impurity concentration profile in the prior art case shown in FIG. 30.

As shown by the solid line 31 in FIG. 3, peaks are provided in a portion near the interface between the n⁺-type source region 23 and the p-type base region 22 and in a portion near the interface between the p-type base region 22 and the n-type semiconductor layer 27. The impurity concentration of the p-type base region 22 becomes higher in a deeper portion of the p-type base region 22. In this case, a portion of the high impurity concentration formed in the portion near the interface between the p-type base region 22 and the n-type semiconductor layer 27 is also dealt with as a peak for convenience. For example, the impurity concentration is determined based on the dose amount and acceleration voltage set when boron (B) or the like is doped into the p-type base region 22. In this case, a region having an impurity concentration of 40% or more of the maximum value of the impurity concentration of the p-type base region 22 occupies 60% or more of the p-type base region 22.

Further, since the n-type semiconductor layer 27 is formed between the p-type base region 22 and the n⁻-type drain region 21, a steeper pn junction portion is formed between the p-type base region 22 and the n-type semiconductor layer 27. Therefore, a shape similar to a so-called BOX shape in which the impurity concentration profile of the p-type base region 22 is flat in a portion near the maximum value and the pn junction portions of the p-type base region 22 with the n⁺-type source region 23 and the n-type semiconductor layer 27 are steep can be attained.

In FIG. 3, an example in which the profile having the maximum impurity concentration in the portion near the interface between the n⁺-type source region 23 and the p-type base region 22 is shown. However, it is also possible to attain a profile having the maximum impurity concentration in a portion near the interface between the p-type base region 22 and the n-type semiconductor layer 27. For example, the above profile can be formed by adequately selecting the acceleration voltage and the like set when impurity is doped into the p-type base region 22.

Further, the first peak which determines the threshold voltage of the MOSFET can be positioned near an interface between the n⁺-type source region 23 and the p-type base region 22 or an interface between the n-type semiconductor layer 27 and the p-type base region 22.

Thus, a shape similar to the BOX shape can be attained by forming the peak of the impurity concentration of the p-type base region 22 in a portion near the n-type semiconductor layer 27. Further, by forming the above profile of the impurity concentration of the p-type base region 22, the channel length (the distance between the n⁺-type source region 23 and the n-type semiconductor layer 27) can be shortened while the integral value of an amount of the p-type impurity doped into the p-type base region 22 is maintained. Therefore, the ON resistance can be reduced and the switching characteristic can be enhanced.

As described above, since the integral value of an amount of the p-type impurity doped into the p-type base region 22 is maintained, an impurity dose amount which prevents a leakage current from flowing even when reverse bias voltage is applied between the n⁺-type source region 23 and the n⁻-type drain region 21 can be acquired. Therefore, high withstand voltage can be attained. Further, since the channel length can be reduced, the ON resistance can be lowered while the high withstand voltage is maintained. As a result, a vertical MOSFET having a high withstand voltage of approximately 300 V, for example, can be provided.

Further, since the impurity concentration profile is approximately set to a BOX shape as shown in FIG. 3, occurrence of a variation in the threshold voltage or withstand voltage for each of the vertical MOSFET elements can be prevented. Therefore, a semiconductor device with the high reliability can be provided.

Further, the n-type semiconductor layer 27 having the impurity concentration higher than that of the n⁻-type drain region 21 is formed on the boundary portions between the gate insulating film 25, p-type base region 22 and n⁻-type drain region 21. Therefore, the ON resistance can be reduced and a current path for a current to pass through the channel can be acquired.

Further, the film thickness of a portion of the insulating film 25 which is formed in contact with the n-type semiconductor layer 27 is made larger than the film thickness of the other portion. Therefore, it can be prevented that the feedback capacitance between the gate electrode 26 and the n⁻-type drain region 21 becomes large to elongate the switching time. That is, an increase in the feedback capacitance can be suppressed and the switching time can be reduced. The film thickness of the other portion is made smaller than the film thickness of the portion of the insulating film 25 which is formed in contact with the n-type semiconductor layer 27. Therefore, even when gate voltage is applied to the gate electrode 26, there occurs no possibility that the tendency of the channel to be inverted will become weak and the ON resistance will become higher. Thus, the ON resistance and the feedback capacitance between the gate electrode 26 and the n⁻-type drain region 21 can be reduced and the switching time can be further shortened.

Figure 4:
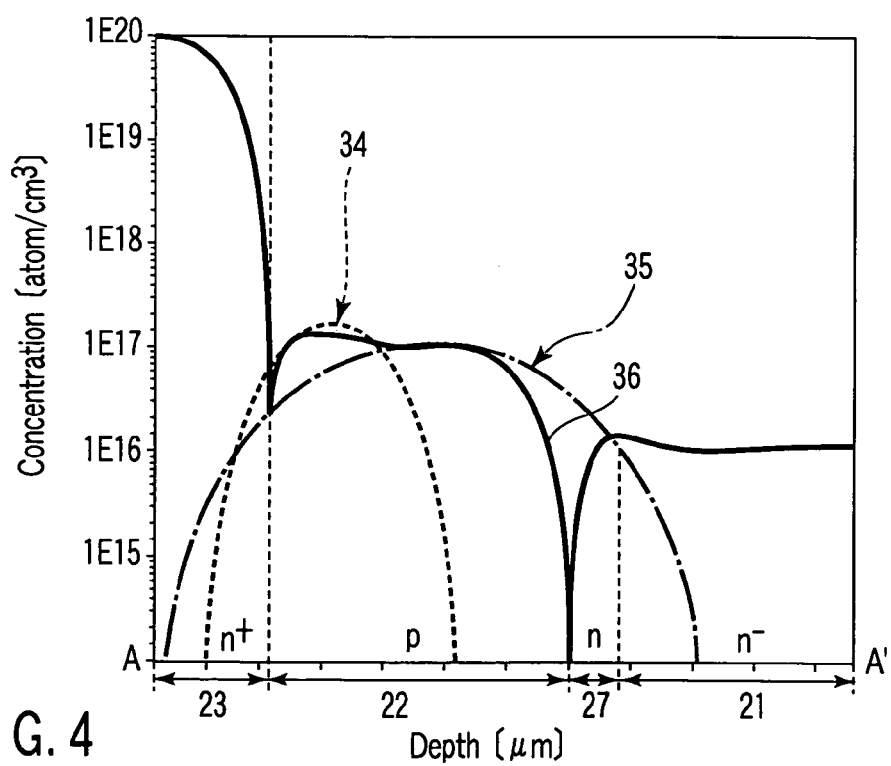
FIG. 4 is a diagram showing another example of the impurity concentration profile along the A–A' line in FIG. 2.

Another example of the impurity concentration along the A–A' line in FIG. 2 is explained with reference to FIG. 4. In FIG. 4, broken lines 34 indicate the impurity concentration when impurity is ion-implanted to mainly determine the threshold voltage (Vth) in a shallow layer of the p-type base region 22. Further, a one-dot-dash line 35 indicates the impurity concentration when impurity is ion-implanted to mainly determine the total amount of p-type impurity in a deep layer of the p-type base region 22. In addition, a solid line 36 indicates the impurity concentration obtained by adding together the impurity concentrations indicated by the broken lines 34 and one-dot-dash line 35. As shown in FIG. 4, two peaks of the impurity concentration are provided in the p-type base region 22.

By providing the profile as shown in FIG. 4, the p-type base region 22 which is more similar to the BOX shape can be formed. Therefore, the ON resistance and the feedback capacitance between the gate and the drain can be further reduced.

In FIG. 4, an example in which two peaks of the impurity concentration are provided is shown, but it is of course possible to attain the same effect even when a larger number of peaks are provided. That is, for example, even when a larger number of ion-implantation steps are used, the same effect as described above can be attained if the region can be made more similar to the BOX shape.

Next, it is assumed that the width of a portion of the n⁻-type drain region 21 which is formed in contact with the bottom portion of the trench 24 is set at X1 [μm] and the minimum width (cell pitch width) of an repetition interval of the gate electrodes 26 in the gate width direction is set at X2 [μm]. It is desirable to set X1 and X2 so as to satisfy the relation of $0.05 < X1/X2 < 0.25$. This is explained in more detail with reference to FIG. 5. In FIG. 1, a single vertical MOSFET is shown, but it is of course possible to arrange a plurality of vertical MOSFETs each of which is the same as the vertical MOSFET shown in FIG. 1 in the gate width direction.

Figure 5:
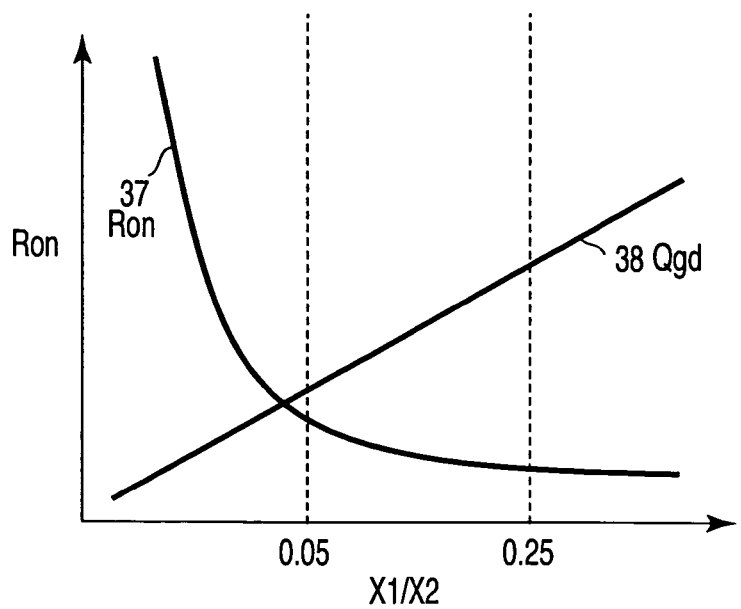
FIG. 5 is a diagram schematically showing the characteristics of ON resistance Ron and gate-drain feedback capacitance Qgd with respect to X1/X2 in FIG. 1.

FIG. 5 is a diagram schematically showing the characteristics of ON resistance Ron and gate-drain feedback capacitance Qgd with respect to X1/X2. A solid line 37 in FIG. 5 indicates the ON resistance Ron, a solid line 38 indicates the feedback capacitance Qgd between the gate electrode 26 and the n⁻-type drain region 21. As shown in FIG. 5, in a range of $0.05 < X1/X2 < 0.25$, the values of the ON resistance Ron and gate-drain feedback capacitance Qgd are kept small. Therefore, in the range of $0.05 < X1/X2 < 0.25$, the ON resistance and gate-drain feedback capacitance can be reduced.

Further, it is assumed that the depth from the surface of the n⁺-type source region 23 to the deepest bottom portion of the p-type base region 22 is set at Y2 [μm] and the depth from the deepest bottom portion of the trench 24 to the deepest bottom portion of the p-type base region 22 is set at Y1 [μm]. It is desirable to set Y1 and Y2 so as to satisfy the relations of 0<Y1<1.2 [μm] and Y2<3 [μm]. The depth Y1 is explained in more detail with reference to FIG. 6.

Figure 6:
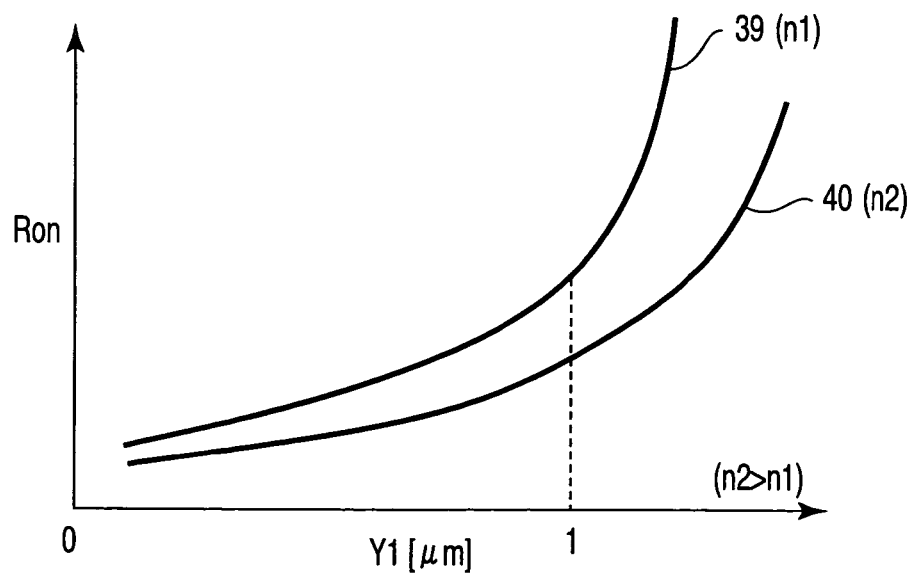
FIG. 6 is a diagram schematically showing the characteristic of ON resistance Ron with respect to Y1 in FIG. 1.

FIG. 6 is a diagram schematically showing a characteristic of the ON resistance Ron with respect to Y1. A solid line 39 in FIG. 6 indicates a characteristic of the ON resistance Ron when the impurity concentration of the p-type base region 22 is n1 [/cm$^2$] and a solid line 40 indicates a characteristic of the ON resistance Ron when the impurity concentration of the p-type base region 22 is n2 [/cm$^2$]. In this case, the impurity concentration n2 is higher than the impurity concentration n1 (n2>n1). As shown in FIG. 6, in the range of 0<Y1<1.2 [μm], the ON resistance Ron is kept low in each of the characteristics shown in a solid line. 39 and 40. Therefore, the ON resistance can be kept low in the range of 0<Y1<1.2 [μm]. Further, even when the depth to the deepest bottom portion of the trench 24 and the depth to the deepest bottom portion of the p-type base region 22 are substantially the same (Y1≈0), it is of course possible to further reduce the ON resistance. As shown in FIG. 6, in the range of 0<Y1<1 [μm], it is possible to further reduce the ON resistance.

Since the channel length increases when Y2 increases, the ON resistance increases. Therefore, it is desirable to set Y2 so as to satisfy the relation of Y2<3 [μm].

As described above, by setting the depths Y1, Y2 to satisfy the relations of 0<Y1<1.2 [μm] and Y2<3 [μm], the ON resistance can be further reduced.

Next, a manufacturing method of the semiconductor device according to the first embodiment is explained with reference to FIGS. 7 to 14 by using the vertical MOSFET shown in FIG. 1 as an example.

Figure 7:
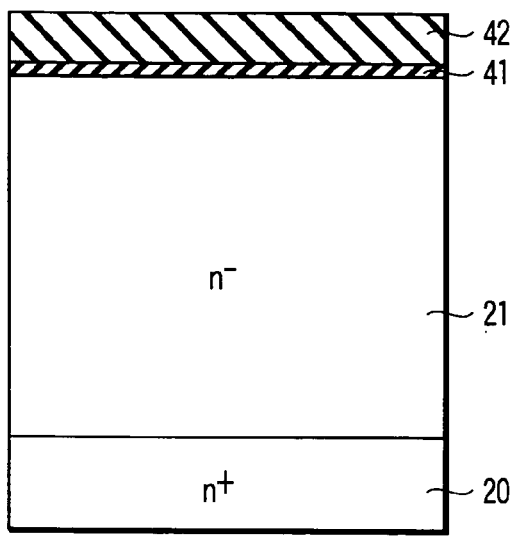
FIGS. 7 to 19 are cross-sectional views showing manufacturing steps for forming the semiconductor device according to the first embodiment of this invention.

First, as shown in FIG. 7, an n$^-$-type drain region 21 which is used as a drain region is formed on the main surface of an n$^+$-type semiconductor substrate 20 by the epitaxial growth method, for example. Further, an oxide film 41 is formed on the n$^-$-type drain region 21 by a thermal oxidation method, for example. Next, an oxide film 42 is deposited and formed on the oxide film 41 by use of a CVD (Chemical Vapor Deposition) method, for example. The film thickness of the oxide film 41 is formed as thin as 200 to 1500 angstrom and the film thickness of the oxide film 42 is formed as thick as several thousand angstrom. The oxide film 42 is deposited and formed as a mask member which is used to form a trench in the n$^-$-type drain region 21.

Then, photoresist is coated on the oxide film 42 and the thus formed photoresist film is exposed and developed to form a pattern (not shown) which is used to form a trench on the oxide film 42. After this the photoresist film is removed.

Figure 8:
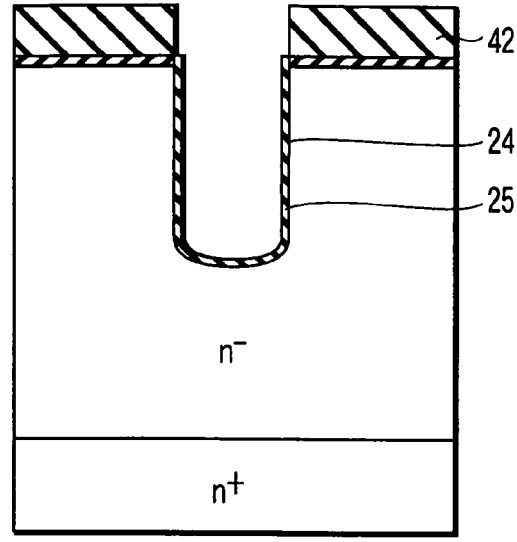

Next, as shown in FIG. 8, for example, an anisotropic etching process is performed by use of a reactive ion etching (RIE) method, for example, to form a trench 24 which penetrates the oxide film 41 and has preset depth to reach the n$^-$-type drain region 21 while the trench pattern formed on the oxide film 42 is used as a mask. After this, for example, an oxide film 25 is formed in the internal portion of the trench 24 by the thermal oxidation method.

As the step of forming the trench 24, it is possible to use a LOCOS (Local Oxidation of Silicon) method, for example. The trench 24 can be formed shallow by using the above method.

Figure 9:
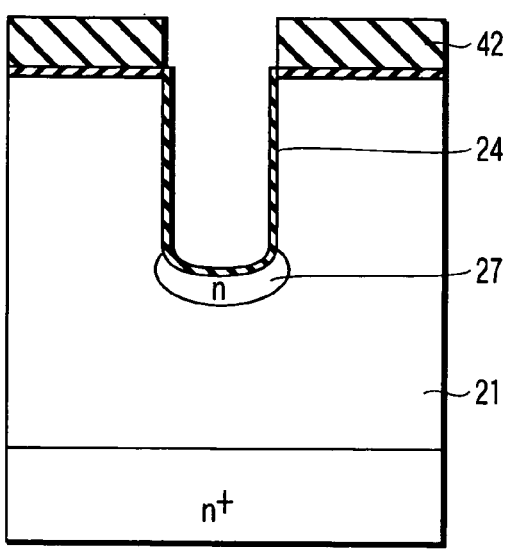

Next, as shown in FIG. 9, for example, an n-type impurity such as phosphorus (P) or arsenic (As) is doped into the n$^-$-type drain region 21 on the bottom portion of the trench 24 by the ion-implantation method, for example, while the oxide film 42 on which the pattern is formed is used as a mask. By the above step, an n-type semiconductor layer 27 is formed. After this, the oxide film 42 is removed.

Figure 10:
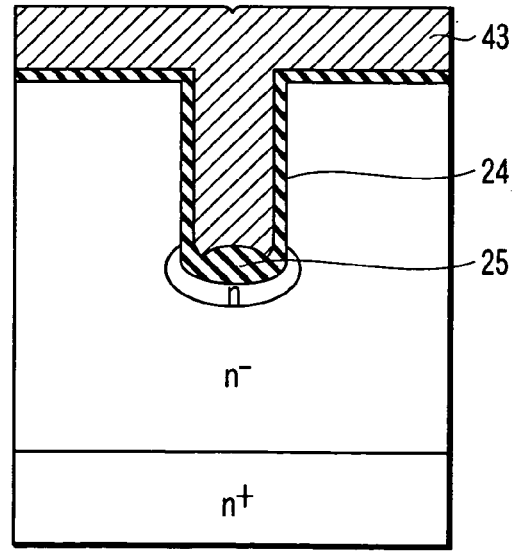

After this, as shown in FIG. 10, for example, the film thickness of a gate insulating film 25 on the bottom portion of the trench 24 is made thick by use of the thermal oxidation method. Next, a gate electrode member 43 used as a gate electrode 26 is deposited and formed on the entire surface by the CVD method, for example. The gate electrode member 43 is formed of polysilicon, for example.

The film thickness of the oxide film 25 formed on the side surface of the trench 24 is approximately 400 angstrom or less and the film thickness of the insulating film 25 formed on the bottom portion of the trench 24 is approximately 500 to 1000 angstrom, for example. Further, the oxide film 25 on the bottom portion of the trench 24 can be formed by separating the insulating film from the side surface of the trench 24 after the n-type semiconductor layer 27 is formed and forming a thick oxide film by use of the thermal oxidation method, for example.

Figure 11:
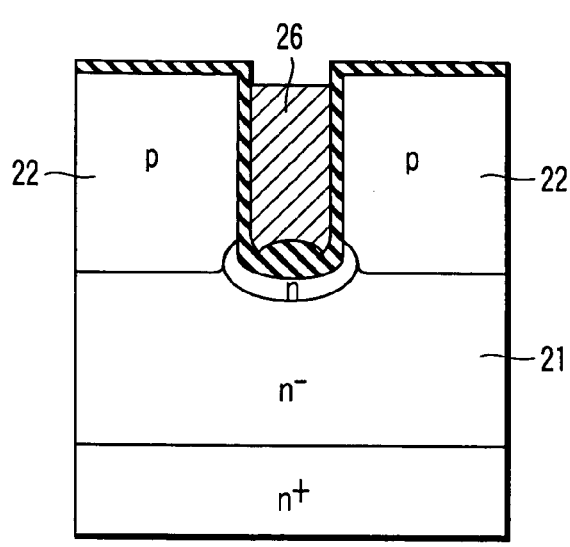

Next, as shown in FIG. 11, for example, a gate electrode material 43 is filled in the trench by a CMP (Chemical Mechanical Polishing) method to form a gate electrode 26. For example, the gate electrode 26 can also be formed by an isotropic etching process such as a wet etching process or by an anisotropic process by the RIE method.

After this, a p-type impurity such as boron (B) or the like is doped into the n$^-$-type drain region 21 by use of the ion-implantation method, for example. In this case, the acceleration voltage is set at an adequately selected level and ion-implantation is performed to form a peak of the impurity concentration in a deep position. Then, by performing the heat treatment at high temperatures (for example, 1000° C. or more) to activate implanted ions, a p-type base region 22 whose impurity concentration profile is made similar to the BOX shape is formed.

As the method for forming the p-type base region 22 and n-type semiconductor layer 27, a selective epitaxial growth method or the like can be used.

Figure 12:
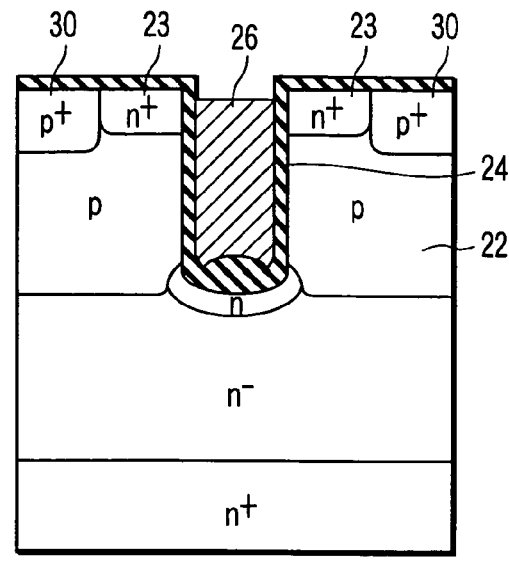

Next, as shown in FIG. 12, an n$^+$-type impurity such as phosphorus (P) or arsenic (As) is doped into the surface layer of the p-type base region 22 which is formed in contact with the side surfaces of the trench 24 to selectively form n$^+$-type source regions 23. Then, a p-type impurity such as boron (B) is doped into the surface layer of the p-type base region which is adjacent to the n$^+$-type source regions 23 to form p$^+$-type semiconductor layers 30. The p-type base region 22 and n$^+$-type source region 23 can be formed before the trench 24 is formed.

Figure 13:
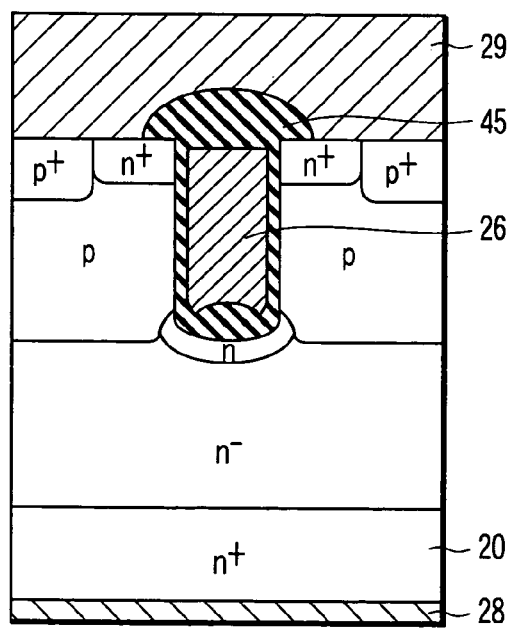

After this, as shown in FIG. 13, for example, an insulating film 45 is formed by the thermal oxidation method to electrically isolate the gate electrode 26. Further, for example, an isotropic or anisotropic etching process is performed to remove the insulating film 41 on the n$^+$-type source region 23 and p$^+$-type semiconductor layer 30 and expose a silicon portion which is to be contacted. Next, a source electrode 29 is formed on the n$^+$-type source region 23, p$^+$-type semiconductor layer 30 and insulating film 45. Further, a drain electrode 28 is formed on the other surface (rear surface) of the n$^+$-type semiconductor substrate 20 which is opposite to the main surface thereof.

By the above steps, the vertical MOSFET shown in FIG. 1 is manufactured.

In the above manufacturing steps, after the n-type semiconductor layer 27 is formed in a portion in contact with the bottom portion of the trench 25, impurity is ion-implanted to form an impurity concentration peak in a deeper portion and is thermally diffused to form the p-type base region 22. By the above steps, the n-type semiconductor layer 27 functions as a stopper for the p-type impurity to determine the lower limit of the impurity concentration of the p-type base region 22 in the step of ion-implanting the p-type impurity into the deep portion and in the thermal diffusion step performed after the ion-implanting step. Therefore, the pn junction between the n$^+$-type source region 23 and the n-type semiconductor layer 27 can be made steep. Thus, the impurity concentration profile of the p-type base region 22 can be made closer to the BOX shape. Since the trench 24 can be formed shallower in order to further make the impurity concentration profile closer to the BOX shape, it becomes easier to set Y1 so as to satisfy the relation of 0<Y1<1.2 [μm].

The p-type base region 22 is formed by performing the step of ion-implanting p-type impurity ions only once. Therefore, the number of manufacturing steps can be reduced and the manufacturing cost can be lowered.

Further, the n-type semiconductor layer 27 can be formed by use of a selective epitaxial growth method. Also, it is desirable to use arsenic (As) as ions to be implanted to form the n-type semiconductor layer 27. By using arsenic, diffusion in the width direction of the trench 24 can be attained without fail.

Next, a manufacturing method of the semiconductor device having the impurity concentration profile of the p-type base region 22 as shown in FIG. 4 is explained with reference to FIGS. 14 to 19 by taking the vertical MOSFET shown in FIG. 1 as an example.

Figure 14:
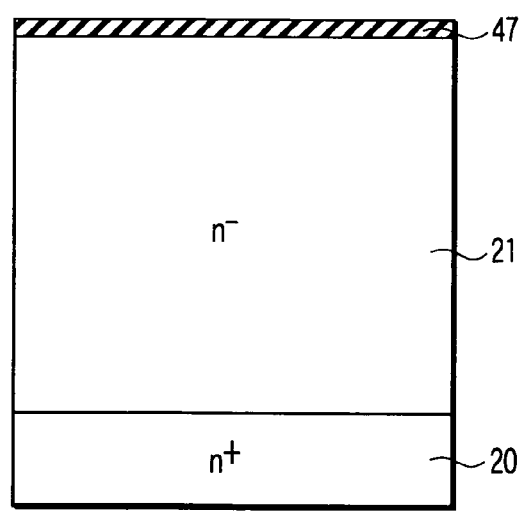

First, as shown in FIG. 14, an n$^-$-type drain region 21 used as a drain region is formed on the main surface of an n$^+$-type semiconductor substrate 20 by the epitaxial growth method, for example. Further, an oxide film 47 is formed on the n$^-$-type drain region 21 by the thermal oxidation method, for example.

Figure 15:
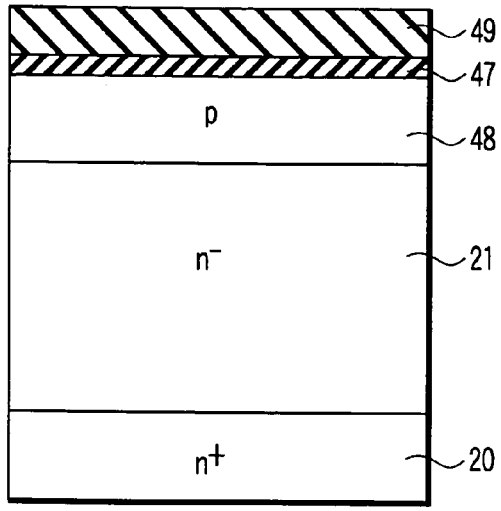

Then, as shown in FIG. 15, a p-type semiconductor layer 48 is formed by doping a p-type impurity such as boron (B) into the n$^-$-type drain region 21 by use of the ion-implantation method, for example. In the above step, the p-type impurity is implanted to mainly set the threshold voltage (Vth) to a preset value in a shallow region. Next, an oxide film 49 is deposited and formed on the oxide film 47 by the thermal oxidation method, for example.

Figure 16:
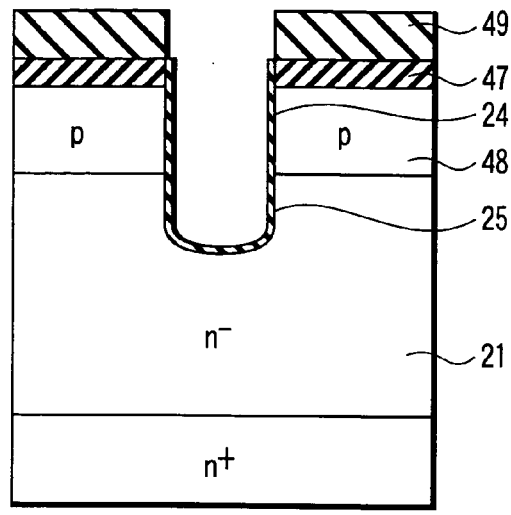

After this, photoresist is coated on the oxide film 49 and the thus formed photoresist film is exposed and developed to form a pattern (not shown) which is used to form a trench on the oxide film 49. Next, as shown in FIG. 16, for example, an anisotropic etching process is performed by use of the RIE method to form a trench 24 which penetrates the oxide films 49, 47 and p-type semiconductor layer 48 and has preset depth to reach the n$^-$-type drain region 21. After this, for example, an oxide film 25 is formed in the internal portion of the trench 24 by the thermal oxidation method.

Figure 17:
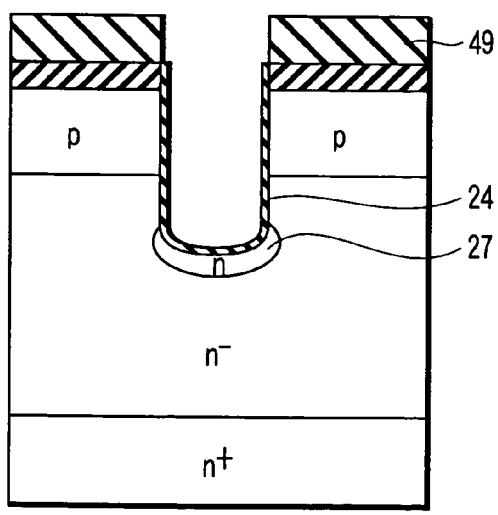

Next, as shown in FIG. 17, for example, an n-type semiconductor layer 27 is formed on the bottom portion of the trench 24 by ion-implanting an n-type impurity such as phosphorus (P), for example, into the n$^-$-type drain region 21 by the ion-implantation method by using the pattern formed on the oxide film 49 as a mask.

Figure 18:
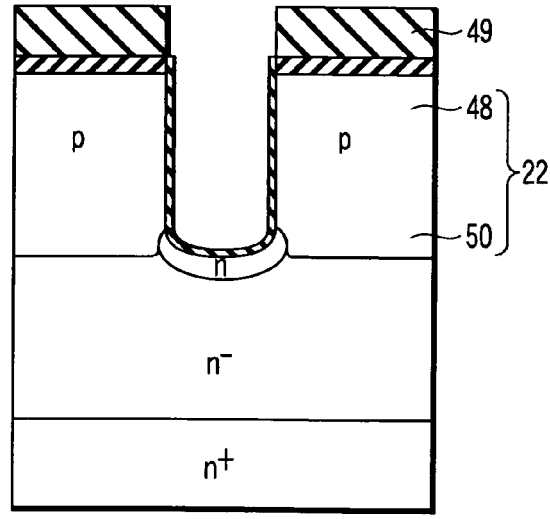

Then, as shown in FIG. 18, a p-type semiconductor layer 50 is formed by ion-implanting a p-type impurity such as boron (B), for example, to mainly set the integral value of the p-type impurity concentration to a preset value in a region deeper than the p-type semiconductor layer 48. Further, a heat treatment process is performed to activate the implanted ions at high temperatures (for example, 1000° C. or more). As a result, the impurity concentration profile can be made further similar to the BOX shape by the presence of the p-type semiconductor layers 48, 50 and a p-type base region 22 having two impurity concentration peaks is formed.

Figure 19:
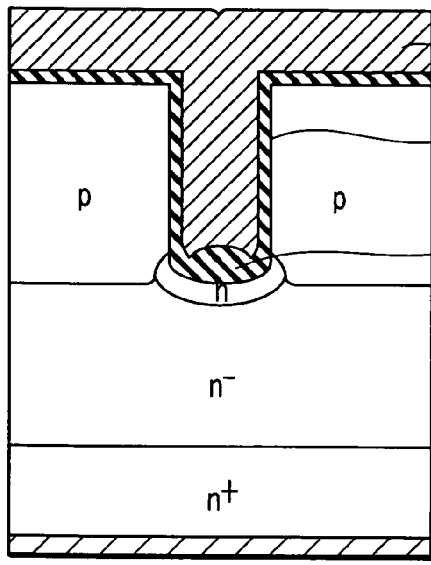

After this, the oxide film 49 is removed. Then, as shown in FIG. 19, for example, a thermal oxidation method is carried out to increase the film thickness of the insulating film 25 on the bottom portion of the trench 24. Next, a gate electrode material 43 is deposited and formed on the entire surface by the CVD method, for example.

After this, the vertical MOSFET shown in FIG. 1 is manufactured by the same steps as those shown in FIGS. 11 to 13.

In the above manufacturing steps, the impurity concentration profile of the p-type semiconductor layer can be made similar to the BOX shape by the two ion-implantation steps. Therefore, ion-implantation is performed to mainly set the threshold voltage (Vth) to a preset value in a shallow layer in the first ion-implantation step. Then, in the second ion-implantation step, ion-implantation is performed to mainly set the integral value of the impurity concentration to a preset value in a deep layer. As described above, the impurity concentration profile can be set closer to the BOX shape by separately performing the ion-implantation steps. The number of ion-implantation steps is not limited to two and it is of course possible to form the p-type base region 22 by performing three or more ion-implantation steps.

Further, an n-type semiconductor layer 27 is formed on the bottom portion of the trench 24 before the second ion-implantation step. Therefore, the n-type semiconductor layer 27 can be used as a stopper in the second ion-implantation step and the later heat treatment process. Further, the lower limit of the impurity concentration of the p-type base region 22 can be determined and the pn junction between the n$^+$-type source region 23 and the n$^-$-type drain region 21 can be made steep. Therefore, the impurity concentration profile of the p-type base region 22 can be set closer to the BOX shape. The other effect which is the same as that shown in FIGS. 7 to 14 can be attained.

[Second Embodiment]

A semiconductor device according to a second embodiment of this invention is explained with reference to FIG. 20. In the following explanation of the present embodiment, portions different from those of the first embodiment are explained in more detail and the explanation for the like portions is omitted.

Figure 20:
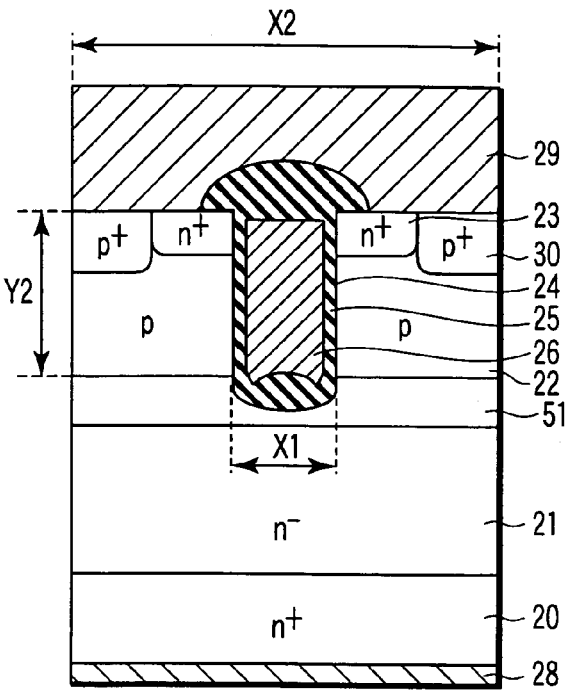
FIG. 20 is a cross-sectional view showing a semiconductor device according to a second embodiment of this invention.

FIG. 20 is a cross-sectional view showing the semiconductor device according to the second embodiment of this invention. As shown in FIG. 20, a current passage acquiring layer 51 is formed on an n$^-$-type drain region 21. A trench 24 is formed into the current passage acquiring layer 51. The bottom portion of the trench 24 shown in FIG. 20 is formed shallower than the deepest portion of the current passage acquiring layer 51. However, it can be formed to penetrate the current passage acquiring layer 51 and extend into the n$^-$-type drain region 21.

The current passage acquiring layer 51 is used to acquire a passage of a current flowing between an n$^+$-type source region 23 and the n$^-$-type drain region 21 in the p-type base region 22 and reduce the feedback capacitance between the gate and drain. As the current passage acquiring layer 51, for example, a layer containing carbon or an n-type layer whose impurity concentration is higher than that of the n$^-$-type drain region 21 can be used.

Further, like the first embodiment, it is desirable to set X1, X2 and Y1 so as to satisfy the relation of 0.05<X1/X2<0.25 and Y2<3 [μm].

The passage of a current flowing between the n$^+$-type source region 23 and the n$^-$-type drain region 21 in the p-type base region 22 can be acquired and the feedback capacitance between the gate and drain can be reduced by use of the current passage acquiring layer 51.

When the current passage acquiring layer 51 is formed of an n-type high-impurity concentration layer, the p-type base region 22 in the second embodiment has an impurity concentration profile as shown in FIG. 3 in a portion near the entire interface between the p-type base region 22 and the current passage acquiring layer 51.

Further, if the trench 24 is formed to penetrate the current passage acquiring layer 51 and extend into the n$^-$-type drain region 21, the same effect as described above can be attained.

Next, a manufacturing method of the semiconductor device according to the second embodiment is explained with reference to FIGS. 21 and 22.

Figure 21:
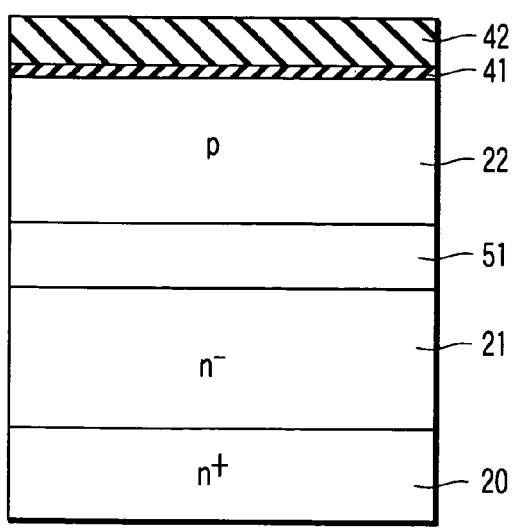
FIGS. 21 and 22 are cross-sectional views showing manufacturing steps for forming the semiconductor device according to the second embodiment of this invention.
Figure 22:
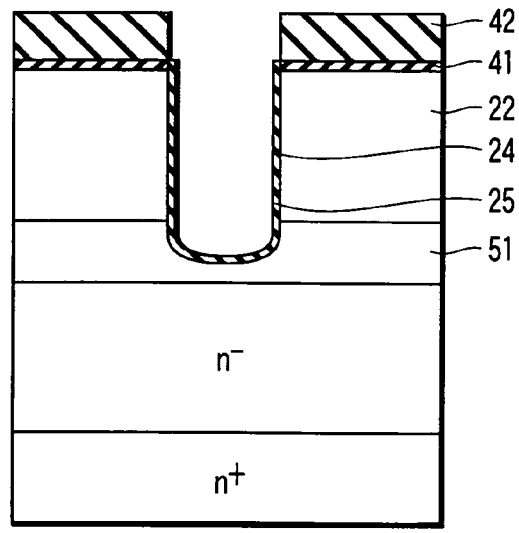

As shown in FIG. 21, an n$^-$-type drain region 21 which is used as a drain region is formed on the main surface of an n$^+$-type semiconductor substrate 20 by the epitaxial growth method, for example. Further, a current passage acquiring layer 51 is formed on the n$^-$-type drain region 21 by the epitaxial growth method, for example. Next, a p-type base region 22 by the epitaxial growth method, for example, and oxide films 41, 42 by the oxidation method, for example, are sequentially formed. In this case, as the current passage acquiring layer 51, a layer containing carbon or an n-type semiconductor layer formed by the epitaxial growth method can be used, for example.

Then, photoresist is coated on the oxide film 42 and the thus formed photoresist film is exposed and developed to form a pattern (not shown) which is used to form a trench on the oxide film 42. Next, the photoresist film is removed. Further, as shown in FIG. 22, for example, an anisotropic etching process is performed by use of the RIE method, for example, with the oxide film 42 used as a mask to form a trench 24 which penetrates the oxide film 41 and p-type base region 22 and has preset depth to reach the current passage acquiring layer 51. Then, an oxide film 25 is formed in the internal portion of the trench 24 by the thermal oxidation method, for example.

After this, the semiconductor device shown in FIG. 20 is manufactured by the same steps as those shown in FIGS. 9 to 13.

In the above manufacturing steps, the current passage acquiring layer 51 is formed on the n$^-$-type drain region 21 before the p-type base region 22 is formed. Therefore, impurities in the p-type base region 22 and current passage acquiring layer 51 can be prevented from being diffused into each other. Thus, the pn junction between the p-type base region 22 and the current passage acquiring layer 51 can be made steep. As a result, the impurity concentration profile of the p-type base region 22 can be set closer to the BOX shape.

[Third Embodiment]

Figure 23:
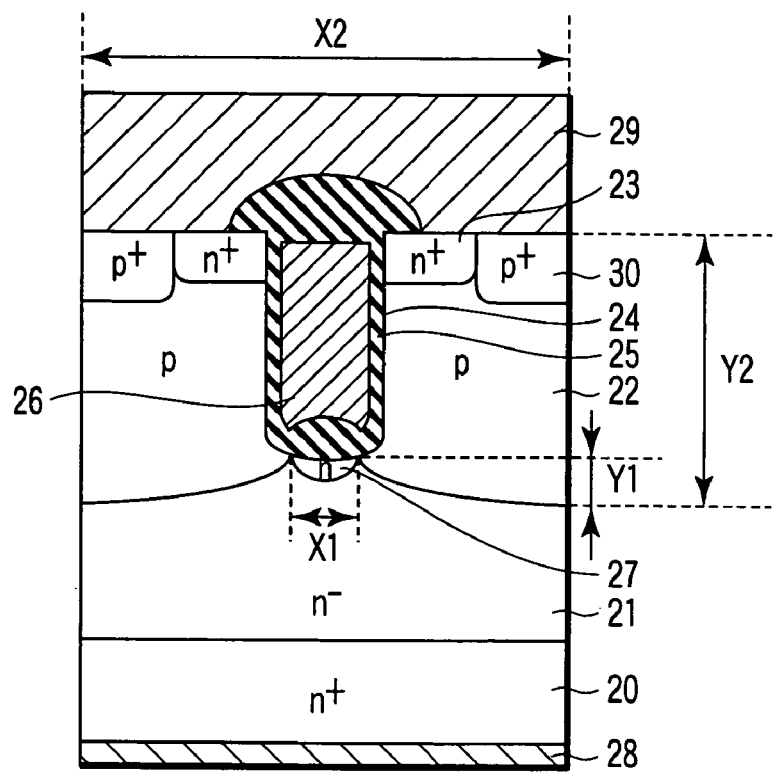
FIG. 23 is a cross-sectional view showing a semiconductor device according to a third embodiment of this invention.

A semiconductor device according to a third embodiment of this invention is explained with reference to FIG. 23. FIG. 23 is a cross-sectional view schematically showing the semiconductor device according to the third embodiment. As shown in FIG. 23, at least part of a boundary portion between an n$^-$-type drain region 21 and a p-type base region 22 can be made deeper than the bottom portion of a trench 24 and the width (that is, X1) of a portion of the n$^-$-type drain region 21 which is formed in contact with and faces at least the bottom portion of the trench 24 can be made smaller than the width of the trench 24.

With the above structure, the facing area between a gate electrode 26 and the n$^-$-type drain region 21 used as a drain can be reduced. Therefore, the feedback capacitance between the gate and drain can be reduced.

Figure 24:
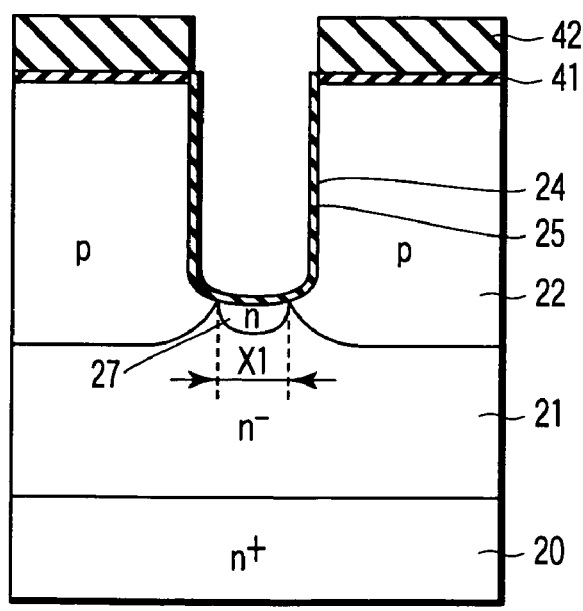
FIG. 24 is a cross-sectional view showing one manufacturing step for forming the semiconductor device according to the third embodiment of this invention.

Next, a manufacturing method of the semiconductor device shown in FIG. 23 is explained with reference to FIG. 24. First, as shown in FIG. 24, an n$^-$-type drain region 21, p-type base region 22 and insulating film 42 are formed on the surface of an n$^+$-type semiconductor substrate 20 by the same steps as those shown in FIGS. 14 and 15. Then, a p-type impurity such as boron (B), for example, is doped into a deep region of the n$^-$-type drain region 21 by the ion-implantation method, for example. In the case of the above step, ion-implantation into a deeper portion can be performed by selectively setting the acceleration voltage at a preset value. After this, a p-type base region 22 whose impurity concentration profile is set closer to the BOX shape is formed by performing the heat treatment process at high temperatures (for example, 1000° C. or more) to activate the doped ions.

Next, a thick insulating film 42 (mask member) used to form a trench is formed on the oxide film 41 by the thermal oxidation method, for example. Then, photoresist is coated on the oxide film 42 and the thus formed photoresist film is exposed and developed to form a pattern (not shown) which is used to form a trench on the oxide film 42. Next, the photoresist film is removed. Further, as shown in FIG. 24, for example, the trench 24 is formed by use of the RIE method with the oxide film 42 used as a mask.

Then, an insulating film 25 is formed in the internal portion of the trench 24 by the thermal oxidation method. Further, an n-type impurity such as phosphorus (P) or arsenic (As) is doped into a portion of the n$^-$-type drain region 21 which is formed in contact with the bottom portion of the trench 24 by the ion-implantation method, for example, so as to form an n-type semiconductor layer 27. In the above step, at least the width of the trench 24 is made larger than X1. It is desirable to use phosphorus (P) as the n-type impurity used in the step of forming the n-type semiconductor layer 27.

After this, the semiconductor device shown in FIG. 23 is manufactured by the same steps as those shown in FIGS. 11 to 13.

It is desirable to use phosphorus (P) in the step of forming the n-type semiconductor layer 27. Since phosphorus (P) can be diffused to a large extent in the depth direction of the trench in the thermal oxidation step and is diffused into the insulating film 25, a region sandwiched between portions of the p-type base region 22 can be freely adjusted by the time and temperature of the thermal diffusion process. Therefore, the n-type semiconductor layer 27 can be easily formed so as to set at least the width of the trench 24 larger than X1.

[Fourth Embodiment]

Next, a semiconductor device according to a fourth embodiment of this invention is explained with reference to FIG. 25. FIG. 25 is a cross-sectional view schematically showing the semiconductor device according to the fourth embodiment of this invention. As shown in FIG. 25, the surface of a gate electrode 26 is set higher than the surface of a trench 24. Further, a low-resistance layer 55 is formed on part of the side surface and the upper surface of the gate electrode 26. As the low-resistance layer 55, a metal layer, silicide layer or the like is used, for example. It is also possible to form the low-resistance layer 55 on the surface of an n$^+$-type source region 23 or p$^+$-type semiconductor layer 30.

As described above, since the surface of the gate electrode 26 is set higher than the surface of the trench 24, the volume of the gate electrode 26 increases. Therefore, the gate resistance of the gate electrode 26 can be lowered. Further, since a desired interval can be attained between the low-resistance layer 55 and the n$^+$-type source region 23 and p$^+$-type semiconductor layer 30 on the semiconductor surface, sufficient insulation therebetween can be attained.

On the other hand, Y2 is maintained, that is, the channel length is kept unchanged. As a result, the gate resistance can be reduced while the ON resistance is maintained. Further, since the surface of the gate electrode 26 is set higher than the surface of the trench 24, the chip size in the X2 direction, that is, in the gate width direction of the gate electrode 26 can be reduced.

In addition, the switching characteristic can be enhanced by lowering the gate resistance. Therefore, when the semiconductor device shown in FIG. 25 is incorporated into a system such as a power supply, for example, the reliability of the whole system can be greatly enhanced due to enhancement of the switching characteristic of each semiconductor device. Thus, it is important to reduce the gate resistance.

Since the low-resistance layer 55 is formed on part of the side surface and the upper surface of the gate electrode 26, the gate resistance can be further reduced. Even when the low-resistance layer 55 is formed on the surface of the n$^+$-type source region 23 or p$^+$-type semiconductor layer 30, the same effect can be attained.

It is of course possible to combine the structure of the gate electrode 26 or low-resistance layer 55 shown in FIG. 25 with the semiconductor device shown in FIGS. 1, 20, 23 or the like.

Next, a manufacturing method of the semiconductor device shown in FIG. 25 is explained with reference to FIGS. 26 to 28.

First, an n$^-$-type drain region 21, trench 24, insulating films 25, 41 and n-type semiconductor layer 27 are formed on the main surface of an n$^+$-type semiconductor substrate by the same steps as the steps shown in FIGS. 7 to 9.

Next, as shown in FIG. 26, for example, a gate electrode material 43 is deposited and formed by the CVD method. Further, for example, an anisotropic etching process is performed by the RIE method with a photoresist film 57 used as a mask to etch the gate electrode material 43 and form a gate electrode 26 so that the surface of the gate electrode 26 can be set higher than the surface of the trench 24.

Figure 27:
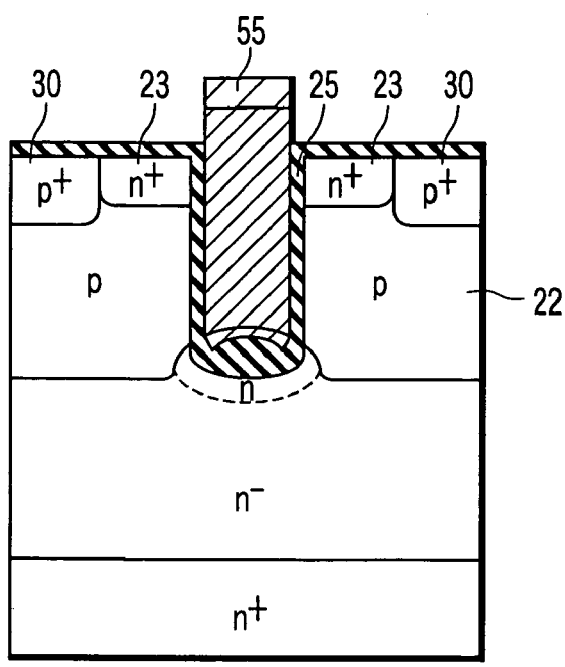

Then, as shown in FIG. 27, an n$^+$-type source region 23 and p$^+$-type semiconductor layer 30 are formed by use of the same step as the step shown in FIG. 12. It is possible to form the n$^+$-type source region 23 before the trench 24 is formed.

Next, for example, an oxide film is formed on the entire surface and a side wall is formed on the side surface of polysilicon which projects from the silicon surface by subjecting the oxide film to the anisotropic etching process by the RIE method. After this, for example, a Ti film (not shown) is formed on the entire surface. Further, the Ti film is subjected to the high-temperature process of temperatures higher than 850° C. to form a low-resistance layer 55 such as a TiSi$_2$ film by the wet process. It is known that the TiSi$_2$ film is aggregated to raise the resistivity thereof if the high-temperature process of temperatures higher than 850° C. is performed in the above step after the low-resistance layer 55 is formed. Therefore, the step of lowering the resistance of the gate electrode material 26 is performed after the n$^+$-type source region 23 and p-type semiconductor layer 30 are formed. That is, the heating process is performed after a metal film (Ti film) is deposited on the gate electrode 26 by a salicide step, for example. Thus, the low-resistance layer 55 is formed by the above step.

After this, an insulating film 24 which provides insulation between the gate electrode material 26 and low-resistance layer 55 and the n$^+$-type source region 23 and p-type semiconductor layer 30 is formed. Then, the semiconductor device shown in FIG. 25 is manufactured by performing a step of removing the insulating film 24 on the p$^+$-type semiconductor layer 30 and at least part of the n$^+$-type source region 23 by an anisotropic etching process or isotropic etching process and forming a source electrode 29.

It is also possible to remove the insulating film 25 on the surface of the p-type base region 22 after the step of forming the gate electrode 26, form the n$^+$-type source region 23 and p-type semiconductor layer 30 and perform the salicide step. By the above step, a silicide layer can be simultaneously formed on the surfaces of the p-type semiconductor layer 30 and at least part of the n$^+$-type source region 23. Therefore, the manufacturing cost can be lowered.

Further, a polysilicon layer can be formed at substantially the same height as a mask material directly on the trench by performing an etching process after the polysilicon layer is deposited with the insulating film 41 or 42 shown in FIGS. 7 to 9 left behind to attain the semiconductor device shown in FIG. 25. In this case, the step is effective when the semiconductor device is miniaturized without causing the positional deviation in the right and left directions with respect to the trench in comparison with the step in which the resist is used and the merit of a reduction in the number of steps can be attained.

[Fifth Embodiment]

A semiconductor device according to a fifth embodiment of this invention is explained with reference to FIG. 28.

Figure 28:
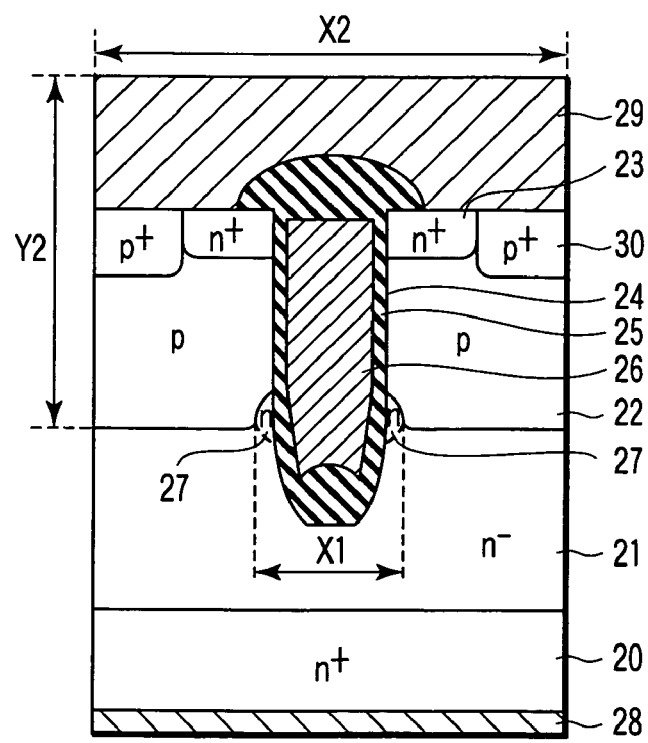
FIG. 28 is a cross-sectional view showing a semiconductor device according to a fifth embodiment of this invention.

FIG. 28 is a cross-sectional view showing the semiconductor device according to the fifth embodiment of this invention. As shown in FIG. 28, a trench 24 is formed to extend from the surface of an n$^+$-type source region 23 to an n$^-$-type drain region 21 through the n$^+$-type source region 23, p-type base region 22 and n-type semiconductor layer 27. Further, the trench 24 is formed to penetrate the n$^+$-type source region 23 and p-type base region 22. The bottom portion of the trench 24 is formed to be deeper than the deepest bottom portion of the p-type base region 22. The n-type semiconductor layer 27 is formed between the p-type base region 22 and the n$^-$-type drain region 21 and divided into two portions which sandwich the trench 24.

Further, the two portions of the n-type semiconductor layer 27 are formed in contact with the p-type base region 22 to sandwich the trench 24. The n-type semiconductor layer 27 is formed with the impurity concentration higher than that of the n$^-$-type drain region 21.

By forming the trench with the above structure, the ON resistance can be further reduced. Further, by using the n-type semiconductor layer 27 with the above structure, the channel length can be made smaller. As a result, the switching characteristic can be enhanced.

The film thickness of an insulating film formed at least on the bottom portion of the trench 24 can be made larger than that of an insulating film 25 formed on the side wall of the trench 24. Therefore, the high withstand voltage can be maintained even if the trench 24 is formed deep.

Next, a manufacturing method of the semiconductor device shown in FIG. 28 is explained with reference to FIG. 29.

First, an n$^-$-type drain region 21, trench 24, insulating film 25 and n-type semiconductor layer 27 are formed on the main surface of an n⁺-type semiconductor substrate 20 by the same steps as those shown in FIGS. 7 to 9. In this case, it is desirable to use an SiN film or the like deposited and formed by the CVD method, for example, as the insulating film 25.

Next, for example, the etching process is performed by the RIE method so as to elongate the trench 24 so that the trench 24 can penetrate the n-type semiconductor layer 27 and reach the deep portion of the n⁻-type drain region 21. Further, the film thickness of the insulating film on the side wall of the elongated trench 24 and the film thickness of the insulating film 25 on the bottom portion thereof are made larger by use of the thermal oxidation method, for example.

Figure 29:
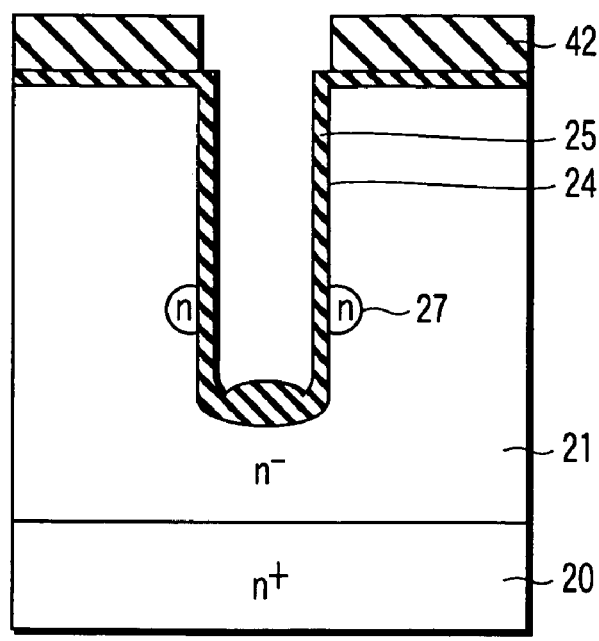
FIG. 29 is a cross-sectional view showing one manufacturing step for forming the semiconductor device according to the fifth embodiment of this invention.

After this, the semiconductor device shown in FIG. 29 is manufactured by the same steps as those shown in FIGS. 10 to 13.

As described above, the insulating film 25 such as an SiN film is used to form the trench 24 before it is elongated, then the trench is formed deeper with the insulating film 25 left behind only on the side wall thereof and, after this, an insulating film with larger film thickness is formed on the bottom portion of the trench 24 which has been elongated. Thus, it becomes possible to form a thin insulating film on the side wall of the trench 24 used as a channel portion and a thick insulating film on the bottom portion of the elongated trench 24. Therefore, the dielectric breakdown strength can be enhanced and the high withstand voltage can be maintained even if the trench is formed deep.

The p-type base region 22 is formed after the n-type semiconductor layer 27 is formed. Therefore, the two portions of the n-type semiconductor layer 27 which are formed to sandwich the trench 24 can be prevented from being diffused into the n⁻-type drain region 21 in the step of forming the p-type base region 22.

In the explanation of the above embodiments, the first conductivity type is set to n and the second conductivity type is set to p. However, the same effect as that of the embodiments of this invention can be attained even if the first conductivity type is set to p and the second conductivity type is set to n.

Only the schematic cross sections of the semiconductor devices explained in the first to fifth embodiments are shown and an example in which the n⁺-type source region 23 is formed to always lie adjacent to the trench 24 with the insulating film 25 disposed therebetween is shown. However, in a semiconductor device having the same cross section, for example, the n⁺-type source region 23 and p⁺-type layer 30 can be arranged to cross a direction in which the trench 24 extends at right angles and the n⁺-type source regions 23 and p⁺-type layers 30 can be alternately arranged in the plane layout structure.

In explaining this invention, the vertical MOSFET is used as one example. However, this invention can easily be applied to another semiconductor device such as an IGBT.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first semiconductor layer of a first conductivity type;
   a second semiconductor layer of a second conductivity type formed on a main surface of the first semiconductor layer;
   a third semiconductor layer of the first conductivity type formed in the second semiconductor layer and electrically isolated from the first semiconductor layer;
   a trench formed to extend from the surface of the third semiconductor layer and penetrate the third semiconductor layer and having depth to reach at least a portion lying near the first semiconductor layer;
   a first insulating film formed on side walls and a bottom portion of the trench;
   a first electrode formed at least partly on the first insulating film in the trench and electrically isolated from the first to third semiconductor layers; and
   a fourth semiconductor layer of the first conductivity type formed near the trench on an interface between the first and second semiconductor layers and having an impurity concentration higher than that of the first semiconductor layer,
   wherein an impurity concentration profile of a part, formed along and directly facing a side surface of the trench, of the second semiconductor layer has a first peak and a second peak.

2. The semiconductor device according to claim 1, wherein the first peak exists near an interface between the third semiconductor layer and the second semiconductor layer.

3. The semiconductor device according to claim 1, wherein the second peak exists near an interface between the fourth semiconductor layer and the second semiconductor layer.

4. The semiconductor device according to claim 1, wherein the impurity concentration profile of the second semiconductor layer has a plurality of peaks.

5. The semiconductor device according to claim 1, wherein film thickness of a portion of the first insulating film which lies near the bottom portion of the trench is larger than that of a portion of the insulating film which lies on the side wall portion of the trench.

6. The semiconductor device according to claim 1, wherein the fourth semiconductor layer is formed near the bottom portion of the trench.

7. The semiconductor device according to claim 1, wherein the trench is formed to penetrate at least part of the first semiconductor layer and the fourth semiconductor layer is formed on the side wall portion of the trench.

8. The semiconductor device according to claim 1, wherein the fourth semiconductor layer is a current passage acquiring layer formed between the first and second semiconductor layer layers and the trench is formed to have depth to reach the current passage acquiring layer.

9. The semiconductor device according to claim 8, wherein the current passage aquiring layer contains carbon.

10. The semiconductor device according to claim 1, wherein an interface between the second and first semiconductor layers is shallow in a portion near the trench and deep in a peripheral portion thereof.

11. The semiconductor device according to claim 8, wherein Y1 and Y2 are set to satisfy the relation of 0<Y1<1.2 [μm] and Y2<3 [μm] when the depth from the surface of the third semiconductor layer to the deepest bottom portion of the second semiconductor layer is set to Y2 [μm] and the depth from the deepest bottom portion of the trench to the deepest bottom portion of the second semiconductor layer is set to Y1 [μm].

12. The semiconductor device according to claim 1, further comprising a fifth semiconductor layer of the second conductivity type formed adjacent to the third semiconductor layer on the second semiconductor layer.

13. The semiconductor device according to claim 10, further comprising a second electrode formed on a rear surface of the first semiconductor layer which is opposite to the main surface thereof; a second insulating film formed on the first insulating film and the first electrode; and a third electrode formed on the third semiconductor layer, fifth semiconductor layer and second insulating film.

14. The semiconductor device according to claim 1, wherein the first electrode is formed of polysilicon.

15. The semiconductor device according to claim 1, wherein an upper portion of the first electrode partly protrudes from the trench.

16. The semiconductor device according to claim 15, further comprising a low-resistance layer formed on at least part of the surface of the first electrode which protrudes from the trench.

17. The semiconductor device according to claim 1, wherein the first peak determines at least a threshold voltage, and the second peak determines a dose amount of the impurities.

18. A semiconductor device comprising:
a first semiconductor layer of a first conductivity type;
a second semiconductor layer of a second conductivity type formed on a main surface of the first semiconductor layer;
a third semiconductor layer of the first conductivity type formed in the second semiconductor layer and electrically isolated from the first semiconductor layer;
a trench formed to extend from the surface of the third semiconductor layer and penetrate the third semiconductor layer and having depth to reach at least a portion lying near the first semiconductor layer;
a first insulating film formed on side walls and a bottom portion of the trench;
a first electrode formed at least partly on the first insulating film in the trench and electrically isolated from the first to third semiconductor layers; and
a fourth semiconductor layer of the first conductivity type formed near the trench on an interface between the first and second semiconductor layers and having an impurity concentration higher than that of the first semiconductor layer,
wherein an impurity concentration profile of a part, formed along and directly facing a side surface of the trench, of the second semiconductor layer has a peak in a portion near an interface between the second and fourth semiconductor layers.

19. The semiconductor device according to claim 18, wherein film thickness of a portion of the first insulating film which lies near the bottom portion of the trench is larger than that of a portion of the insulating film which lies on the side wall portion of the trench.

20. The semiconductor device according to claim 18, wherein the fourth semiconductor layer is formed near the bottom portion of the trench.

21. The semiconductor device according to claim 18, wherein the trench is formed to penetrate at least part of the first semiconductor layer and the fourth semiconductor layer is formed on the side wall portion of the trench.

22. The semiconductor device according to claim 18, wherein the fourth semiconductor layer is a current passage acquiring layer formed between the first and second semiconductor layers and the trench is formed to have depth to reach the current passage acquiring layer.

23. The semiconductor device according to claim 22, wherein the current passage acquiring layer contains carbon.

24. The semiconductor device according to claim 18, wherein an interface between the second and first semiconductor layers is shallow in a portion near the trench and deep in a peripheral portion thereof.

25. The semiconductor device according to claim 24, wherein Y1 and Y2 are set to satisfy the relation of 0<Y1<1.2 [μm] and Y2<3 [μm] when the depth from the surface of the third semiconductor layer to the deepest bottom portion of the second semiconductor layer is set to Y2 [μm] and the depth from the deepest bottom portion of the trench to the deepest bottom portion of the second semiconductor layer is set to Y1 [μm].

26. The semiconductor device according to claim 18, further comprising a fifth semiconductor layer of the second conductivity type formed adjacent to the third semiconductor layer on the second semiconductor layer.

27. The semiconductor device according to claim 26, further comprising a second electrode formed on a rear surface of the first semiconductor layer which is opposite to the main surface thereof; a second insulating film formed on the first insulating film and the first electrode; and a third electrode formed on the third semiconductor layer, fifth semiconductor layer and second insulating film.

28. The semiconductor device according to claim 18, wherein the first electrode is formed of polysilicon.

29. The semiconductor device according to claim 18, wherein an upper portion of the first electrode partly protrudes from the trench.

30. The semiconductor device according to claim 27, further comprising a low-resistance layer formed on at least part of the surface of the first electrode which protrudes from the trench.

31. A semiconductor device comprising:
a first semiconductor layer of a first conductivity type;
a second semiconductor layer of a second conductivity type formed on a main surface of the first semiconductor layer;
a third semiconductor layer of the first conductivity type formed in the second semiconductor layer;
a trench formed to extend from the surface of the third semiconductor layer and penetrate the third semiconductor layer and having depth to reach at least a portion lying near the first semiconductor layer;
a first insulating film formed on side walls and a bottom portion of the trench;
a first electrode formed at least partly on the first insulating film in the trench; and
a fourth semiconductor layer of the first conductivity type formed near the trench on an interface between the first and second semiconductor layers and having an impurity concentration higher than that of the first semiconductor layer,
wherein a region of not less than 60% of the second semiconductor layer has at least 40% of the maximum value of the impurity concentration of a part, formed along and directly facing a side surface of the trench, of the second semiconductor layer.

32. The semiconductor device according to claim 31, wherein film thickness of a portion of the first insulating film which lies near the bottom portion of the trench is larger than that of a portion of the insulating film which lies on the side wall portion of the trench.

33. The semiconductor device according to claim 31, wherein the fourth semiconductor layer is formed near the bottom portion of the trench.

34. The semiconductor device according to claim 31, wherein the trench is formed to penetrate at least part of the first semiconductor layer and the fourth semiconductor layer is formed on the side wall portion of the trench.

35. The semiconductor device according to claim 31, wherein the fourth semiconductor layer is a current passage acquiring layer formed between the first and second semiconductor layers and the trench is formed to have depth to reach the current passage acquiring layer.

36. The semiconductor device according to claim 35, wherein the current passage acquiring layer contains carbon.

37. The semiconductor device according to claim 31, wherein an interface between the second and first semiconductor layers is shallow in a portion near the trench and deep in a peripheral portion thereof.

38. The semiconductor device according to claim 31, wherein Y1 and Y2 are set to satisfy the relation of $0<Y1<1.2$ [μm] and $Y2<3$ [μm] when the depth from the surface of the third semiconductor layer to the deepest bottom portion of the second semiconductor layer is set to Y2 [μm] and the depth from the deepest bottom portion of the trench to the deepest bottom portion of the second semiconductor layer is set to Y1 [μm].

39. The semiconductor device according to claim 27, further comprising a fifth semiconductor layer of the second conductivity type formed adjacent to the third semiconductor layer on the second semiconductor layer.

40. The semiconductor device according to claim 39, further comprising a second electrode formed on a rear surface of the first semiconductor layer which is opposite to the main surface thereof; a second insulating film formed on the first insulating film and the first electrode; and a third electrode formed on the third semiconductor layer; fifth semiconductor layer and second insulating film.

41. The semiconductor device according to claim 27, wherein the first electrode is formed of polysilicon.

42. The semiconductor device according to claim 27, wherein an upper portion of the first electrode partly protrudes from the trench.

43. The semiconductor device according to claim 36, further comprising a low-resistance layer formed on at least part of the surface of the first electrode which protrudes from the trench.

44. A semiconductor device comprising:
a first semiconductor layer of a first conductivity type;
a second semiconductor layer of a second conductivity type formed on a main surface of the first semiconductor layer;
a third semiconductor layer of the first conductivity type formed in the second semiconductor layer;
a trench formed to extend from the surface of the third semiconductor layer and penetrate the third semiconductor layer and having depth to reach at least a portion lying near the first semiconductor layer;
a first insulating film formed on side walls and a bottom portion of the trench;
a first electrode formed at least partly on the first insulating film in the trench; and
a fourth semiconductor layer of the first conductivity type formed near the trench on an interface between the first and second semiconductor layers and having an impurity concentration higher than that of the first semiconductor layer;

wherein the relation of $0.18<X1/X2<0.25$ is set up when the minimum width of a repetition interval of elements is set at X2 [μm] and a distance between regions of the second semiconductor layer which face each other to sandwich the trench is set at X1 [μm].

45. The semiconductor device according to claim 38, wherein film thickness of a portion of the first insulating film which lies near the bottom portion of the trench is larger than that of a portion of the insulating film which lies on the side wall portion of the trench.

46. The semiconductor device according to claim 38, wherein the fourth semiconductor layer is formed near the bottom portion of the trench.

47. The semiconductor device according to claim 38, wherein the trench is formed to penetrate at least part of the first semiconductor layer and the fourth semiconductor layer is formed on the side wall portion of the trench.

48. The semiconductor device according to claim 38, wherein the fourth semiconductor layer is a current passage acquiring layer formed between the first and second semiconductor layers and the trench is formed to have depth to reach the current passage acquiring layer.

49. The semiconductor device according to claim 42, wherein the current passage acquiring layer contains carbon.

50. The semiconductor device according to claim 38, wherein an interface between the second and first semiconductor layers is shallow in a portion near the trench and deep in a peripheral portion thereof.

51. The semiconductor device according to claim 44, wherein Y1 and Y2 are set to satisfy the relation of $0<Y1<1.2$ [μm] and $Y2<3$ [μm] when the depth from the surface of the third semiconductor layer to the deepest bottom portion of the second semiconductor layer is set to Y2 [μm] and the depth from the deepest bottom portion of the trench to the deepest bottom portion of the second semiconductor layer is set to Y1 [μm].

52. The semiconductor device according to claim 38, further comprising a fifth semiconductor layer of the second conductivity type formed adjacent to the third semiconductor layer on the second semiconductor layer.

53. The semiconductor device according to claim 46, further comprising a second electrode formed on a rear surface of the first semiconductor layer which is opposite to the main surface thereof; a second insulating film formed on the first insulating film and the first electrode; and a third electrode formed on the third semiconductor layer, fifth semiconductor layer and second insulating film.

54. The semiconductor device according to claim 38, wherein the first electrode is formed of polysilicon.

55. The semiconductor device according to claim 38, wherein an upper portion of the first electrode partly protrudes from the trench.

56. The semiconductor device according to claim 49, further comprising a low-resistance layer formed on at least part of the surface of the first electrode which protrudes from the trench.

* * * * *